United States Patent [19]

Simpson et al.

[11] Patent Number: 5,319,646
[45] Date of Patent: Jun. 7, 1994

[54] BOUNDARY-SCAN OUTPUT CELL WITH NON-CRITICAL ENABLE PATH

[75] Inventors: David L. Simpson; Wilson E. Smoak, III, both of West Columbia, S.C.

[73] Assignee: NCR Corporation, Dayton, Ohio

[21] Appl. No.: 762,098

[22] Filed: Sep. 18, 1991

[51] Int. Cl.$^5$ .............................................. H04B 17/00
[52] U.S. Cl. ................................ 371/22.3; 371/22.1; 371/22.5
[58] Field of Search ................ 371/22.1, 22.2, 22.3, 371/22.4, 22.5, 22.6

[56] References Cited

U.S. PATENT DOCUMENTS

| | | | |
|---|---|---|---|
| 4,875,003 | 10/1989 | Burke | 324/73 R |
| 5,084,874 | 1/1992 | Whetsel, Jr. | 371/22.3 |
| 5,103,450 | 4/1992 | Whetsel | 371/22.3 X |

OTHER PUBLICATIONS

IEEE Std 1149.1-1990, "IEEE Standard Test Access Port and Boundary-Scan Architecture", May 21, 1990.
"A Standard Test Bus & Boundary Scan Architecture" by Lee Whetsel, TI Technical Journal, Jul.-Aug. 1988, pp. 48-59.

Primary Examiner—Jack B. Harvey
Assistant Examiner—Eric W. Stamber
Attorney, Agent, or Firm—Paul W. Martin

[57] ABSTRACT

A boundary-scan output cell which includes critical data term and non-critical masking term paths without adding an extra layer of logic. The boundary-scan cell includes a multiplexer, a critical data path which transmits critical data terms, coupled to a first multiplexer input, a sampling circuit which transmits non-critical terms, term circuit coupled to a second multiplexer input, and a non-critical term path which transmits non-critical masking terms, coupled to the shift input of the multiplexer. Non-critical masking terms at the shift input are mimicked at the second input. Provision is also made for a test control circuit and a circuit for monitoring critical and non-critical terms.

3 Claims, 1 Drawing Sheet

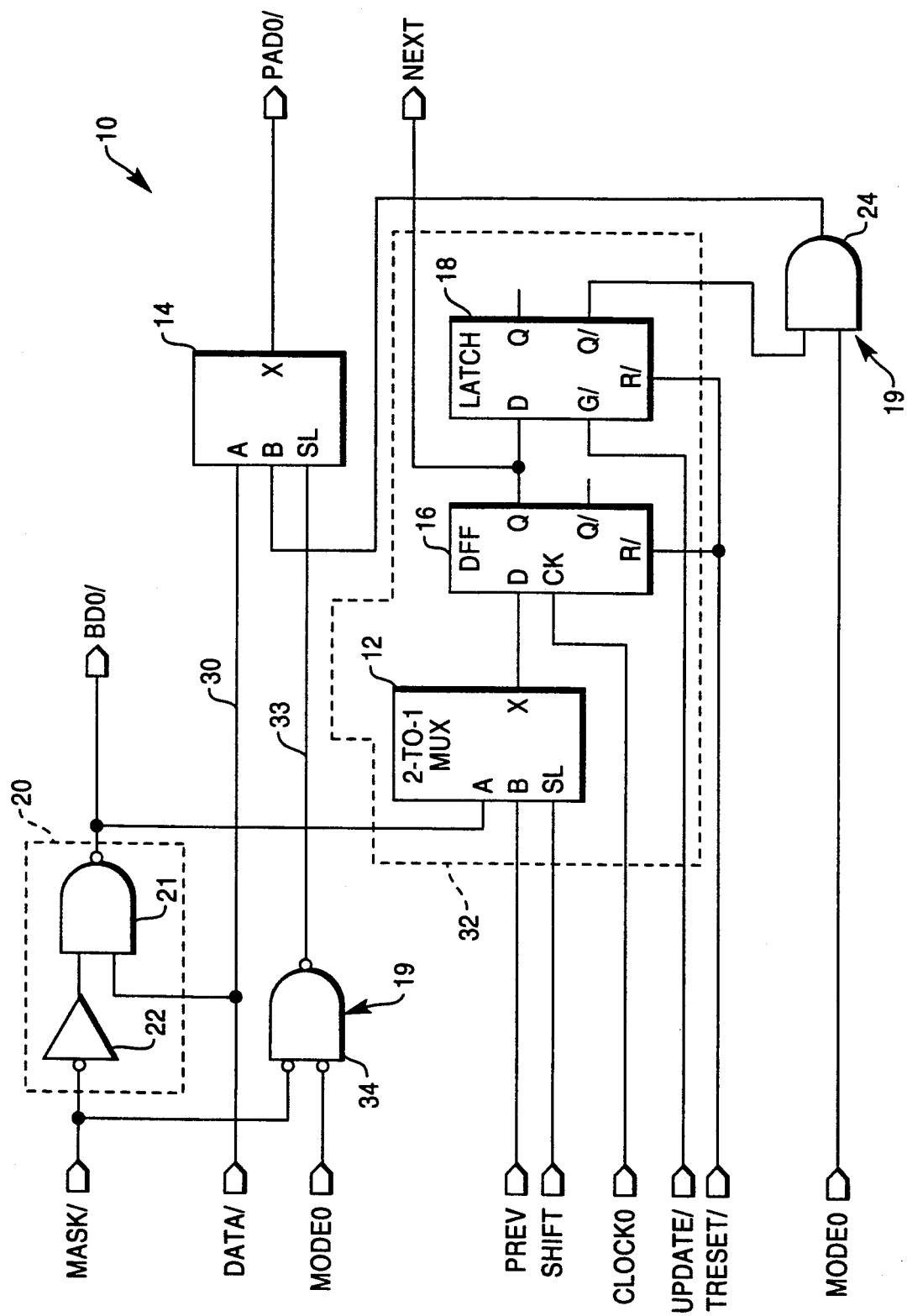

5,319,646

BOUNDARY-SCAN OUTPUT CELL WITH NON-CRITICAL ENABLE PATH

CROSS REFERENCE TO RELATED APPLICATIONS

The present invention is related to the following commonly assigned and co-pending U.S. applications:

Ser. No. 07/761,126, entitled, "Boundary-scan Input Cell for a Clock Pin", and invented by Simpson;

Ser. No. 07/761,141, now U.S. Pat. No. 5,260,950 entitled, "Boundary-scan Input Circuit a Reset Pin", and invented by Simpson and Langford;

Ser. No. 07/761,607 allowed, entitled, "Boundary-scan Enable Cell with a Non-critical Enable Path", and invented by Simpson and Smoak; and Ser. No. 07/668,531 abandoned, entitled, "Bi-directional Boundary-scan Circuit", and invented by Simpson and Hutton.

BACKGROUND OF THE INVENTION

The present invention relates to boundary scan logic and more specifically to a boundary-scan output cell with a non-critical enable path.

Boundary-scan logic circuitry is commonly added to integrated circuits for testing and monitoring the integrated circuits. A discussion of boundary-scan logic can be found in the following publications (1) IEEE standard 1149.1, entitled, "IEEE Standard Test Access port and Boundary-Scan Architecture", dated May 21, 1990; and (2) "A Standard Test Bus and Boundary Scan Architecture", by Lee Whetsel, TI Technical Journal, Jul.–Aug. 1988. These publications are hereby incorporated by reference.

Boundary-scan logic normally includes boundary-scan cells coupled between the pins and the system logic of an integrated circuit for external testing of pin connections and internal testing of system logic. Boundary-scan cells include test signal inputs and outputs through which the cells may be connected and scanned in serial fashion. One type of boundary-scan cell is an output cell for providing a data for an output.

Logic terms making up the core logic output include critical data terms and non-critical masking terms. Critical data terms are those which are active during normal operation and which must propagate to predetermined device pins in a minimal amount of time. Non-critical masking terms are those which may change only during diagnostics, error conditions, or other infrequent events. Such terms are generally asynchronous to the system clock or do not have strict timing requirements. Finally, non-critical masking terms can be used to force an output signal to be asserted or negated.

Boundary-scan cells normally include a shift register, a shadow latch, and two multiplexers. One multiplexer selects between a core logic output defining a system path for carrying data output terms and a shadow latch output defining a test path for carrying test data. An inherent problem with these cells is that the one multiplexer causes delay in the transmission of system data output terms.

Therefore, it would be desirable to provide a boundary-scan cell which separates data terms from non-critical masking terms while minimizing the delay added to the system path.

SUMMARY OF THE INVENTION

In accordance with the teachings of the present invention, a boundary-scan output cell with a non-critical path is provided. The boundary-scan output cell includes a selector element having first, second, and shift inputs. A critical data term path couples system logic and the first input of the selector element. A sampling circuit is coupled between the system logic and the second input of the selector element. A non-critical term path couples system logic to the shift input.

The sampling term circuit employs a multiplexer having a term input and a previous cell contents input. A shift register is coupled to the output of the multiplexer. A latch is coupled between the output of the shift register and the second input of the selector element.

A monitoring circuit, coupled between the system logic and the term input of the multiplexer, also has a test output for comparison with a twin cell.

Provision is also made for a test control circuit as part of the sampling circuit, including a first subcircuit coupled between the latch output and the second input of the selector element, and a second subcircuit coupled between the system logic and the shift input of the selector element.

The boundary-scan output cell of the present invention is operative to transmit non-critical masking terms from system logic through the selector element without adding an extra layer of logic.

It is accordingly an object of the present invention to provide a boundary-scan output cell.

It is another object of the present invention to provide a boundary scan output cell which includes separate circuit paths for critical data terms and non-critical masking terms without adding an extra layer of logic.

BRIEF DESCRIPTION OF THE DRAWING

Additional benefits and advantages of the present invention will become apparent to those skilled in the art to which this invention relates from the subsequent description of the preferred embodiments and the appended claims, taken in conjunction with the accompanying drawing, in which:

FIG. 1 is a schematic diagram of the boundary-scan output cell of the present invention.

DETAILED DESCRIPTION OF THE PREFERRED EMBODIMENT

Referring now to FIG. 1, boundary-scan output cell 10 primarily includes multiplexer 12, selector element 14, shift register 16, and latch 18. Multiplexer 12 samples critical data output terms from system logic through monitoring circuit 20 and test data from a previous boundary-scan cell. Input DATA/ receives critical data terms and input MASK/ receives non-critical masking terms. Monitoring circuit 20 preferably includes NAND gate 21, which produces a term output and an output signal BD0/ for sampling, and inverter 22. The previous cell input originates from input PREV. A shift input SHIFT is also provided.

Output X of multiplexer 12 couples to shift register 16. Preferably, shift register 16 employs a D-type flip-flop. Shift register 16 additionally receives system clock signal CLOCK0 and test reset input TRESET/. Output Q couples to another boundary-scan cell and is labeled NEXT.

Output Q of shift register 16 couples to latch 18. Latch 18 additionally receives test reset input TRESET/ and update input UPDATE/ for updating the contents of latch 18 with the contents of register 16.

Output Q/ of latch 18 couples to selector element 14 through first subcircuit 24 of test control circuit 19. Preferably, selector element 14 is a multiplexer. First test control subcircuit 24 is preferably an AND gate. First test control subcircuit 24 receives a mode input MODE0.

Selector element 14 receives critical ,data terms from input DATA/ along critical data path 30 and provides data output PAD0/. Non-critical masking terms from input MASK/ travel to shift input SL along non-critical term path 33. Non-critical terms are also transmitted through sampling circuit 32, which includes logic elements 12, 16, 18, and 24. Advantageously, non-critical terms at shift input SL of selector element 14 are mimicked at input B.

Non-critical term path 33 passes through test control subcircuit 34, which is preferably an OR gate. Subcircuit 34 receives inputs MASK/ and MODE0.

During normal operation, critical data terms from system logic pass through input DATA/ and travel via critical data path 30 through selector element 14. Non-critical masking terms from system logic pass through input MASK/ and travel through subcircuit 34 and along non-critical term path 33 to shift input SL of selector element 14. The non-critical masking terms are asserted and therefore have no effect upon the state of output PAD0/.

During default operation, non-critical masking terms from system logic are negated and pass through input MASK/ and travel through subcircuit 34 and along non-critical term path 33 to shift input SL of selector, element 14. Non-critical terms also travel through sampling circuit 32 and cause input B of selector element 14 to go high. Thus, when negated, the non-critical masking terms negate output PAD0/. Input B equals the state of non-critical masking terms at input SL; non-critical masking terms at input SL of selector element 14 output their equivalent at input B to output PAD0/.

Advantageously, sampling circuit 32 and non-critical term path 33 provide paths for non-critical masking terms without adding delay to critical path 30 and without adding additional levels of logic.

During boundary-scan testing, input B of selector element 14 is selected. Boundary-scan testing is described in the incorporated references. Test reset input TRESET/ is strobed such that output Q of latch 18 is low. Input MODE0 is high. Selector element 14 shifts to output test data from latch 18 through test control subcircuit 24. Data terms from monitoring circuit 20 are captured by shift register 16. Multiplexer 12 is selected to allow shift register 16 to capture previous cell input PREV and output the current contents of shift register 16 to the next cell through output NEXT.

Test control subcircuit 24 serves to enable test instructions. Thus, during testing, input MODE0 is asserted (high).

Although the invention has been described with particular reference to certain preferred embodiments thereof, variations and modifications of the present invention can be effected within the spirit and scope of the following claims.

What is claimed is:

1. A device for isolating an input/output pad from an integrated circuit comprising:
   a selector element having critical data term, non-critical masking term, and shift inputs, the device selecting the critical data term input during normal operation of the integrated circuit and the non-critical masking term input during both test and default operation of the integrated circuit, the selector element including a first multiplexer;
   a sampling circuit coupled to the non-critical masking term input of the first multiplexer including a second multiplexer having a term input and a previous device contents input, a shift register coupled to the output of the second multiplexer including a D-type flip-flop coupled to the output of the second multiplexer, and a latch coupled between the output of the shift register and the non-critical masking term input of the first multiplexer;
   a monitoring circuit, coupled between the system logic and the term input of the second multiplexer, the monitoring circuit including an inverter having a non-critical masking term input and a NAND gate having inverted non-critical mask term and critical data inputs; and
   a test control circuit including a first subcircuit coupled between the latch output and the non-critical mask input of the first multiplexer including an AND gate having latch and mode inputs, and a second subcircuit coupled between the system logic and the shift input of the first multiplexer including an OR gate having non-critical masking term and mode inputs.

2. A boundary-scan cell for testing a system logic and its pin connections comprising:
   a monitoring circuit including an inverter having a non-critical masking term input, and a NAND gate having an inverted non-critical masking term input and a critical data input, which produces a term output;
   a test control circuit including an OR gate having a non-critical masking input and a mode input;
   a first multiplexer having critical data input, non-critical term input, and a shift input coupled to the output of the test control circuit; and
   a sampling circuit coupled between the monitoring circuit and the non-critical term input of the first multiplexer including a second multiplexer having a term input from the monitoring circuit, a shift input, and a previous cell contents input, the sampling circuit further including a shift register coupled to the output of the second multiplexer including a D-type flip-flop, and a latch coupled between the output of the shift register and the non-critical term input of the first multiplexer.

3. The boundary-scan output cell as recited in claim 1, wherein the test control circuit further comprises:
   a first subcircuit coupled between the latch output and the non-critical term input of the first multiplexer including an AND gate having latch and made inputs.

* * * * *